United States Patent
Belot et al.

(10) Patent No.: US 10,164,608 B2
(45) Date of Patent: Dec. 25, 2018

(54) SWITCH WITH PHASE CHANGE MATERIAL

(71) Applicant: COMMISSARIAT A L'ENERGIE ATOMIQUE ET AUX ENERGIES ALTERNATIVES, Paris (FR)

(72) Inventors: Didier Belot, Rives (FR); Aurelien Larie, Grenoble (FR); Baudouin Martineau, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/806,584

(22) Filed: Nov. 8, 2017

(65) Prior Publication Data

US 2018/0138894 A1    May 17, 2018

(30) Foreign Application Priority Data

Nov. 16, 2016 (FR) .................................... 16 61093

(51) Int. Cl.
*H03H 11/20* (2006.01)
*H01L 45/00* (2006.01)
(Continued)

(52) U.S. Cl.
CPC ......... *H03H 11/20* (2013.01); *H01L 27/2436* (2013.01); *H01L 45/06* (2013.01);
(Continued)

(58) Field of Classification Search
None
See application file for complete search history.

(56) References Cited

U.S. PATENT DOCUMENTS 9,368,720 B1 * 6/2016 Moon ................. H01L 45/1286
2008/0007995 A1 1/2008 Schwerin
(Continued)

OTHER PUBLICATIONS

French Preliminary Search Report dated Jul. 19, 2017 in French Application 16 61093 filed on Nov. 16, 2016 (with English Translation of Categories of Cited Documents).
(Continued)

*Primary Examiner* — Jeffery S Zweizig
(74) *Attorney, Agent, or Firm* — Oblon, McClelland, Maier & Neustadt, L.L.P.

(57) ABSTRACT

Switch comprising at least one PCM portion that can be in a conducting or blocked state depending on the amorphous or crystalline state of the PCM that can change state when it is heated,
in which the PCM portion is continuous and has an elongated shape such that an input and an output of the switch are connected to two ends of the PCM portion respectively that are separated from each other by a distance corresponding to the largest dimension of the PCM portion,
and comprising a control device of the state of the switch capable of passing heating currents through the PCM portion, approximately perpendicular to the largest dimension of the PCM portion, from at least two input points separated from each other and separated from the ends of the PCM portion, to at least two output points separated from each other and separated from the ends of the PCM portion.

14 Claims, 6 Drawing Sheets

(51) Int. Cl.
  *H03H 11/28* (2006.01)
  *H03K 5/159* (2006.01)
  *H01L 27/24* (2006.01)
  *H03K 5/00* (2006.01)

(52) U.S. Cl.
  CPC ...... *H01L 45/1206* (2013.01); *H01L 45/1226* (2013.01); *H01L 45/1286* (2013.01); *H03H 11/28* (2013.01); *H03K 5/159* (2013.01); *H03K 2005/0015* (2013.01); *H03K 2005/00026* (2013.01); *H03K 2005/00286* (2013.01)

(56) References Cited

U.S. PATENT DOCUMENTS

| | | |
|---|---|---|
| 2010/0148141 A1 | 6/2010 | Lee et al. |
| 2014/0191181 A1 | 7/2014 | Moon |
| 2016/0035973 A1 | 2/2016 | Raieszadeh et al. |
| 2016/0079019 A1* | 3/2016 | Borodulin ............. H01L 45/144 337/396 |

OTHER PUBLICATIONS

Yonghyun Shim, et al., "RF Switches Using Phase Change Materials," MEMS 2013, pp. 237-240.
Muzhi Wang, et al., "Directly Heated Four-Terminal Phase Change Switches,", Proc. IEEE MTT-S Int. Microw. Symp, 2014, 4 Pages.
Nabil El-Hinnawy, et al., "A Four-Terminal, Inline, Chalcogenide Phase-Change RF Switch Using an Independent Resistive Heater for Thermal Actuation," IEEE Electron Device Letters, vol. 34, No. 10, Oct. 2013, pp. 1313-1315.

* cited by examiner

SWITCH WITH PHASE CHANGE MATERIAL

TECHNICAL DOMAIN AND PRIOR ART

The invention relates to the domain of electronic switches, comprising one or several switches including one or several Phase Change Materials (PCM). Some embodiments apply particularly to switches used in the RF (Radio Frequency) domain. Some embodiments apply particularly to control over switching of a switch using a PCM based technology. Some embodiments are also applicable to the domain of matching and/or phase shifting of transmission lines.

A PCM switch used as a switch operates due to two possible stable states of the PCM:
- an amorphous state with high resistivity (for example several MΩ), by which the switch can be put in a blocked state (OFF state);
- a crystalline state with low resistivity (for example less than 10 mΩ), by which the switch can be put in a conducting state (ON state).

The change from a crystalline state to an amorphous state is made by heating the PCM to high temperatures (for example between about 600° C. and 1000° C. depending on which PCM is used) for a very short period (for example between about 10 ns and 100 ns). The change from the amorphous state to the crystalline state is made by heating the PCM more gently (for example between about 150° C. and 250° C., depending on the material used) but for a longer period than for the change from the crystalline state to the amorphous state (for example between about 1 μs and 10 ms).

Since the two PCM states (crystalline and amorphous) are stable, there is no need to maintain a control current or voltage on the switch to maintain the conducting or blocked state, which saves energy compared with other switching technologies such as technologies that make use of FET transistors or PIN diodes.

There are several direct or indirect heating structures integrated into PCM components that can be used to change the state of a PCM.

The document by Y. Shim et al., "RF switches using phase change materials", Proc. IEEE Int. Conf. Microelectromech. Syst., Taipei, Taiwan, January 2013, pp. 237-240, describes fast manufacturing of an RF switch comprising one or several vias made from GeTe inserted in a vertical stack including a port of the metallic RF input line and a port of the metallic RF output line. When the PCM is in the amorphous state, no RF electrical signal passes between the input line and the output line. When the PCM is in the crystalline state, an RF electrical signal can be transmitted between the input line and the output line. The state change of the PCM is made by passing a current pulse between the input line and the output line directly through the via(s) in the PCM.

In this structure, the PCM is heated directly. Due to the fact that the PCM portion is thin (thickness less than a few hundred nanometers) and is inserted between the input lines and the output lines, the distance between the input line and the output line is short, thus penalising electrical insulation between these lines when the switch is in the blocked condition. Furthermore, the PCM heating current passes through the RF input and output ports of the switch, possibly causing wear of these ports in the long term and modifying the quality of the RF transmission in this switch.

The document written by M. Wang et al., "Directly heated four-terminal phase change switches," Proc. IEEE MTT-S Int. Microw. Symp., Tampa, Fla., USA, June 2014, pp. 1-4 describes an RF switch in which the PCM is inserted in the same horizontal plane as the metallic RF input and output lines. The PCM phase change is obtained by direct heating by passing a current pulse orthogonal to the direction of RF lines, directly through the PCM using dedicated control electrodes located above and below the PCM.

In this structure, the thickness of the PCM portion is very much less than its width. This ratio between the thickness and the width of the PCM portion is not conducive to a uniform and complete phase change to the crystalline state or to the amorphous state in the entire PCM portion because the area of the PCM through which the current passes orthogonally is too large relative to its thickness. This non-uniform phase change of the PCM is the result of an increase in the resistance of the switch in the conducting state and a reduction of the insulation of the switch in the blocked state. Furthermore, this structure has the disadvantage that it requires the addition of pads dedicated to the PCM state change, in levels other than the levels in which the PCM is located, thus increasing the size of the switch.

The document by N. El-Hinnawy et al. (2013a) «A Four-Terminal, Inline, Chalcogenide Phase-Change RF Switch Using an Independent Resistive Heater for Thermal Actuation», Electron Device Letters, IEEE, Volume: 34, Issue: 10, pp. 1313-1315 describes an RF switch in which the PCM is inserted in the same horizontal plane as the metallic RF input line and the metallic RF output line. In this case the phase change is obtained by passing a current in a thin resistive layer named a "heater" or "radiator" located under the PCM and electrically insulated from the PCM by a dielectric material. When current passes through the "heater", the heater will warm up due to the Joule effect and thermal radiation produced by this "heater" will indirectly change the state of the PCM.

The advantage of this structure is that the thermal radiation zone is defined by the size of the "heater" and not by the size of the PCM portion. Thus, it is easier to homogenise the phase change in the entire PCM.

On the other hand, this "heater" that forms an indirect PCM heating structure, has the disadvantage that it increases the energy consumption necessary to change the state of the PCM, particularly to change from the crystalline state to the amorphous state for which the temperature to be reached has to be high. Another disadvantage of this structure is the fast destruction of the "heater" because the change of the PCM from the crystalline state to the amorphous state requires a very high temperature and consequently current densities that are not easily compatible with this "heater" which is a thin layer resistance.

PRESENTATION OF THE INVENTION

Thus there is a need to propose a switch forming at least one phase change material (PCM) switch, and
- integrating a direct heating structure, in other words a structure in which a heating current passes directly through the PCM, without a radiator type device close to the PCM,
- capable of obtaining a temperature rise of the PCM that is uniform throughout the PCM,
- that has no impact on the transmission path of RF signals through the switch when the switch is in the conducting state,
- that gives good electrical insulation between the switch input and output lines when the switch is in the blocked state, that does not require the addition of pads dedicated to the passage of a heating current to change the state of the PCM, for which the state can be easily programmed.

To achieve this, one embodiment discloses a switch comprising at least one PCM portion that can be in a conducting or blocked state depending on the amorphous or crystalline state of the PCM that can change state when it is heated, in which the PCM portion is continuous and has an elongated shape such that an input and an output of the switch are connected to two ends of the PCM portion respectively that are separated from each other by a distance corresponding to the largest dimension of the PCM portion, and comprising a control device of the state of the switch capable of passing heating currents through the PCM portion, approximately perpendicular to the largest dimension of the PCM portion, from at least two input points separated from each other and separated from the ends of the PCM portion, to at least two output points separated from each other and separated from the ends of the PCM portion.

Heating currents in this switch pass directly through the PCM portion(s), thus avoiding the use of an indirect PCM heating device that increases the energy consumption necessary to change the state of the PCM and for which the life is reduced due to the high heating currents necessary to reach the temperatures required to heat the PCM.

Furthermore, homogeneous heating of the PCM is obtained due to the fact that several heating currents are sent to different points in the PCM portion. Therefore each heating current heats a part of the PCM portion. Therefore the temperature rise obtained in the PCM is uniform throughout the PCM portion. This homogeneity of heating of the PCM portion is also obtained because in this switch, there is no need to make the PCM portion such that its thickness is very much less than its width. This homogeneity of the state (amorphous or crystalline) of the PCM enables the switch to have very low resistance in the conducting state and high insulation in the blocked state.

Heating currents are intended to pass through the PCM portion approximately perpendicular to its largest dimension. Thus, due to the fact that RF signals are intended to pass through the PCM portion (when it is in the conducting state) parallel to this largest dimension, from the input of the switch connected to a first end of the PCM input to the output of the switch connected to a second end of the PCM portion, the RF signal transmission path through the switch when it is in the conducting state is not affected by the heating currents. Furthermore, the heating currents do not pass through the ends of the PCM portion and therefore do not degrade the switch RF input and output ports.

Moreover, due to the fact that the distance separating the switch input and output corresponds to the largest dimension of the PCM portion, the electrical insulation between the switch input and output is good when the switch is in the blocked state.

Another advantage of the structure of this switch is that it does not modify the input impedance of the switch when the switch is in the blocked state, and does not require the addition of any pads specifically for the passage of a heating current for changing the state of the PCM.

The PCM portion is qualified as being "continuous", in other words it does not correspond to several PCM portions with a space between the portions and aligned with each other parallel to the largest dimension of the PCM portion.

Furthermore, the PCM portion is qualified as "elongated" because it has a dimension named the length parallel to an axis, larger than the other dimensions of the PCM portion (for example the width, thickness, etc.), along the other axes.

The control device may comprise a plurality of electronic components that form the first current sources each capable of injecting one of the heating currents into the PCM portion from one of the input points, and second current sources each capable of extracting one of the heating currents from one of the output points.

In this case, the first and second current sources formed by the electronic components of the control device may be configured to be controlled simultaneously by the same control signal CTR. With such a control device, the state of the switch can easily be programmed from a single binary control signal.

Each of the first current sources may comprise at least one MOS transistor comprising one of its source and drain electrodes connected to one of the input points and the other of its source and drain electrodes to an electrical power supply voltage, and in which the control signal CTR can be applied to the gate.

Each of the first current sources may comprise at least one other MOS transistor inserted between said other source and drain electrode of the previous MOS transistor and the electrical power supply potential, and the gate of which is connected to the electrical power supply potential.

In this case, each of the second current sources may comprise at least several MOS transistors mounted in current mirror, at least one of said MOS transistors having a gate to which the control signal CTR can be applied.

In this configuration, the current mirror may comprise a first branch in which a reference current with an imposed value circulates, and a second branch into which the current circulating in the first branch is duplicated. The output point may be connected to the second branch. Each of the first and second branches may comprise at least one MOS transistor controlled by a control signal CTR.

Furthermore, each of the second current sources may also comprise at least one resistive element coupled to the current mirror and capable of forming a resistance with a first or a second value, different from each other and such that the value of the heating current extracted by the second current source is adapted as a function of the state of the switch that will be controlled by the control device. Thus, the values of the heating currents can be adapted depending on the state into which the PCM is required to change. The resistive element may be connected to the first reference branch of the current mirror.

As a variant, the second current sources may be formed from at least one digital—analogue converter. The digital—analogue converter may be such that the converter input signal is a voltage or a current.

Advantageously, the PCM portion may be in the form of a rectangular parallelepiped with a length exceeding its width and its thickness. The length is the largest dimension of the PCM portion.

In this case, the input and output points may be located on the side faces of the PCM portion, spaced that the distance between them is equal to its width. This configuration is advantageous because when the switch is made within an integrated circuit, the switch input and output can be formed by portions of a metallic interconnections level in which the PCM portion is located, and these metallic portions can be placed in contact with the PCM portion. This also prevents the presence of electrical capacitances like those that occur in heating structures according to prior art that heat the PCM directly through its thickness.

The switch may comprise several PCM portions located side by side and approximately parallel to each other, the control device being capable of passing heating currents through each of the PCM portions, approximately perpendicular to the largest dimension of each of the PCM portions, from at least two input points separated from each other and separated from the ends of each of the PCM portions, to at least two output points separated from each other and separated from the ends of each of the PCM portions. This distribution of the total quantity of PCM in the switch into several distinct portions separated from each other (geometrically and thermally) facilitates heating of the PCM so that the PCM can be heated homogeneously, unlike a single PCM portion containing an equivalent quantity of PCM.

When the control device comprises the plurality of electronic components forming the first and second current sources, the switch may also comprise a device coupled to the ends of the PCM portion(s) and capable of compensating for parasite capacitances of MOS transistors that will activate or deactivate the first and second current sources. The addition of such a device to compensate for the parasite capacitances of MOS transistors that will activate or deactivate the first and second current sources reduces constraints on the design of the transistors, to prevent the presence of large parasite capacitances in these MOS transistors.

When the control device comprises the plurality of electronic components forming the first and second current sources, said electronic components may comprise active zones formed in at least one semiconducting layer, and the PCM portion may be located within a metallic interconnections level located above the semiconducting layer and separated from the semiconducting layer by at least one interlayer dielectric. In this case the electronic components may be connected to the PCM portion through conducting vias passing through the interlayer dielectric and possibly one or several other levels of metallic interconnections located between the semiconducting layer and the metallic interconnections level in which the PCM portion is formed.

Another embodiment relates to a transmission line matching device, comprising at least:
 a first portion of electrically conducting material comprising a first end that will be connected to the transmission line and a second end connected to at least one second portion of the electrically conducting material that will be connected to a reference potential,
 a plurality of switches as described previously, the ends of the PCM portion(s) of each of the switches being coupled to the first and second portions of electrically conducting material at different distances from the first end of the first portion of electrically conducting material such that the matching length of the device can be defined by the distance between the first end of the first portion of electrically conducting material and the switch in the conducting state closest to the first end of the first portion of electrically conducting material.

Unlike a variable length transmission line matching device that makes use of transistors to define the matching length, the use of PCM based switches as defined above avoids the problem related to the design of transistors, which must be small to avoid the formation of parasite capacitances with values that are too high, but increases the resistance of the device in the conducting state.

Another embodiment relates to a phase shift device for a differential transmission line, comprising at least:
 several first delay lines that will be coupled to a first electrically conducting portion of the differential transmission line;
 several second delay lines that will be coupled to a second electrically conducting portion of the differential transmission line;
 several switches as described previously, the ends of the PCM portions of each of the switches being coupled to one of the first delay lines and to one of the second delay lines such that said first and second delay lines can be electrically connected to each other when the switch is in the conducting state and can be connected to a reference electrical potential when the switch is in the blocked state.

Unlike a phase shift device using transistors to connect delay lines to each other or to the ground, the use of PCM based switches like those defined above can reduce the resistance of the device in the conducting state (Ron) and the parasite capacitances (Coff) formed within the phase shift device and therefore improve the Ron/Coff ratio of the phase shift device.

BRIEF DESCRIPTION OF THE DRAWINGS

This invention will be better understood after reading the description of example embodiments given purely for information and that are in no way limitative with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

Figure 1:
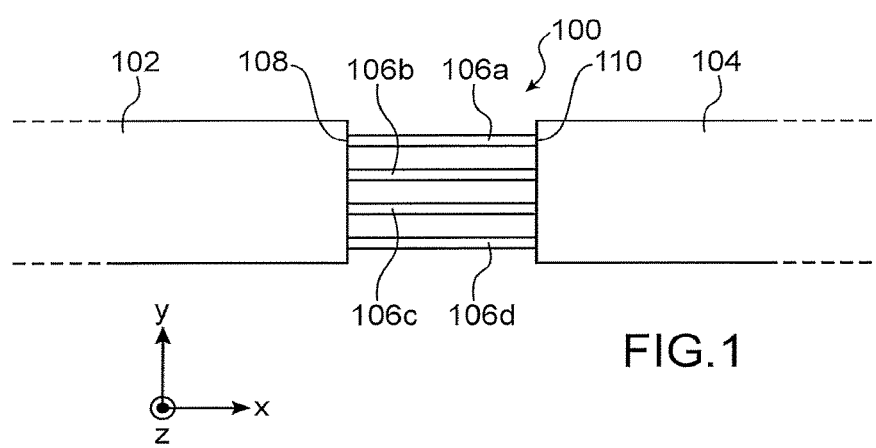
FIG. 1 diagrammatically shows a switch according to one particular embodiment.

Refer firstly to FIG. 1 that diagrammatically shows one particular embodiment of a switch 100.

In this case, the switch 100 is inserted between two metallic lines 102, 104. Line 102 is the RF signal input line into the switch 100 and forms the input to the switch 100. Line 104 is the output line of these RF signals and forms the output from the switch 100.

In this particular embodiment, the switch 100 forms a switch that will or will not allow RF signals to pass from line 102 to line 104, depending on its state (conducting or non-conducting). As a variant, the switch 100 could form several switches capable of routing or directing signals to different conducting paths.

The switch 100 comprises several PCM portions 106 (four portions on FIG. 1, references 106a-106d) each of which has an elongated shape, in other words one dimension (the length) of each portion is larger than its other dimensions (for example its width and thickness). The largest dimension of each PCM portion 106 is approximately parallel to the direction of displacement of RF signals that will pass through the switch 100 from line 102 to line 104. Furthermore, each PCM portion 106 is continuous, unlike the case of several PCMs separated from each other.

The PCM of portions 106 may for example be GeTe, or any other appropriate phase change material, for example comprising at least one of the following materials: $Ge_2Sb_2Te_5$, GeTeN, GeTeC, GeTeB.

Figure 2:
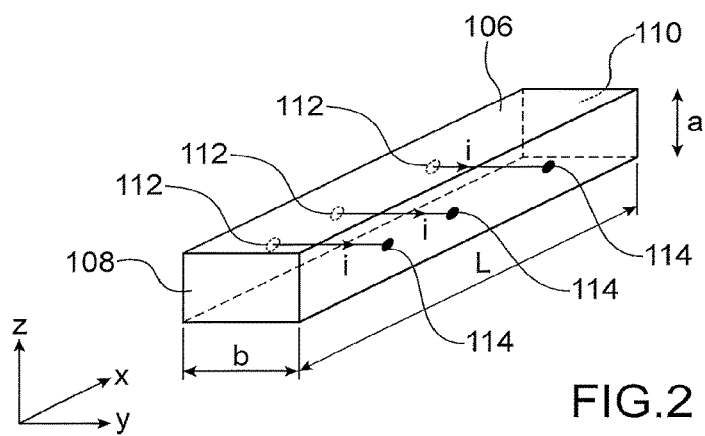
FIG. 2 diagrammatically shows a PCM portion of a switch according to one particular embodiment.

One of the PCM portions 106 is shown in more detail on FIG. 2. In this case the portion 106 is elongated along the direction of the X axis, in other words its largest dimension L named the length is parallel to this X axis. The RF signals will pass through the portion 106 from a first end 108 connected to line 102 to a second end 110 of the portion 106 connected to the line 104, these two ends 108, 110 being separated from each other by a distance equal to the length L.

On the example in FIG. 2, the portion 106 comprises a section in a plane perpendicular to its length L, approximately rectangular in shape and with dimensions a×b, where a is the thickness of the portion 106 and b is its width. Considering the different dimensions of portion 106, the following relations are satisfied: L>a and L>b. The L/b ratio is also advantageously greater than or equal to 30.

In general, each portion 106 may comprise a section in a plane perpendicular to its length L, with a shape other than rectangular, the dimensions of this section (sides, diameter, etc.) being less than the length L of the portion 106.

The phase change of the material in each portion 106 is controlled by a control circuit 116 (not shown on FIG. 2) forming several heating current sources that will impose electrical currents at several input points of each of the portions 106, the currents passing through each of the portions 106 from these input points to exit from one of the portions 106 at several output points. The control circuit 116 also forms current sources connected to these output points to "draw" or extract heating currents from these output points to carry them outside portions 106. On the example in FIG. 2, the figure symbolically shows that heating currents "i" pass through the portion 106 from three input points 112, these heating currents i being output from portion 106 at three output points 114 each approximately facing one of the input points 112.

The input and output points 112, 114 of the heating currents passing through each of the portions 106 are preferably defined, in other words are positioned on portion 106, such that the heating currents pass through the portion 106 parallel to its width b. However, it is possible as a variant that these input and output points 112, 114 could be arranged such that the heating currents that will change the state of the PCM of portion 106 pass through the portion 106 parallel to its thickness a.

The control circuit 116 forms a set of programmable heating current sources that inject local heating currents through the width of the portions 106, and extract these heating currents.

Figure 3:
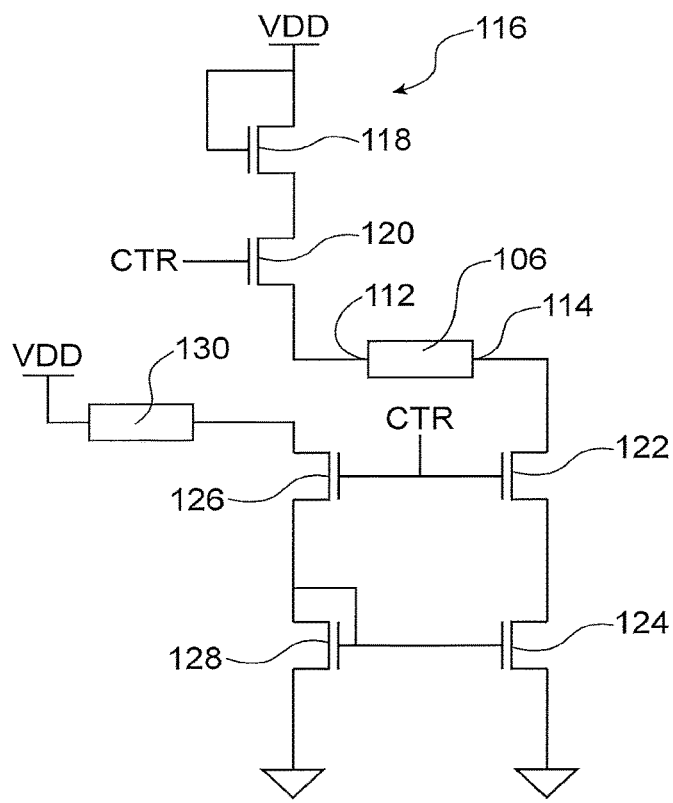
FIG. 3 diagrammatically shows some of the electronic elements of a control circuit of a switch according to a first particular embodiment.

FIG. 3 diagrammatically shows some of the electronic elements of the control circuit 116 according to one particular example embodiment, the shown electronic elements sending a heating current through the portion 106 from one of the input points 112 and extraction of this heating current from one of the output points 114.

These electronic elements include a first MOS transistor 118 with its gate connected to either the source or drain electrode (to the drain in the case of an N type transistor 118 as shown on FIG. 3) itself connected to an electric power supply potential $V_{DD}$. The other source and drain electrode of the first transistor 118 is connected to one of the source and drain electrodes of a second MOS transistor 120 (drain in the case of an N type transistor 120), the other source or drain electrode of which is connected to the input point 112. A control signal CTR will be applied onto the gate of the second transistor 120.

The first and second transistors 118, 120 form a first controlled current source capable of injecting a heating current "i" into the input point 112 when the CTR signal makes the second transistor 120 conducting. The first transistor 118 forms an element insulating the second transistor 120 from the potential $V_{DD}$ when the second transistor 120 is blocked.

The other electronic elements of the control circuit 116 that can be seen on FIG. 3 form a second controlled current source that can extract or "pull" the heating current injected into the input point 112, from the output point 114.

These electronic elements include a third MOS transistor 122 of which one of the source and drain electrodes (the drain in the case of an N type transistor) is connected to the output point 114. The control signal CTR will be applied onto the gate of the third transistor 122. The other source and drain electrode of the third transistor 122 is connected to one of the source and drain electrodes (drain in the case of an N type transistor) of a fourth MOS transistor 124, the other source or drain electrode of which is connected to the ground.

The other electronic elements forming the second current source also include fifth and sixth transistors 126, 128 coupled to the third and fourth transistors 122, 124 such that these four transistors 122-128 form a current mirror. Thus, the control signal CTR will also be applied onto the gate of the fifth transistor 126. Moreover, the gate of the sixth transistor 128 is connected to the gate of the fourth transistor 124 and to the source and drain electrode of the sixth transistor 128 that is connected to the fifth transistor 126.

One of the source and drain electrodes of the fifth transistor 126 (that is not connected to the sixth transistor 128, and that corresponds to the drain in the case of an N type transistor) is connected to a resistive element 130 that may be equal to two different electrical resistance values named R1 and R2, depending on a control signal applied on this element. This variable resistive element 130 is also connected to the electrical power supply potential $V_{DD}$.

In the configuration shown on FIG. 3, the current mirror comprises a first branch formed by the resistive element 130 and the fifth and sixth transistors 126, 128 in which a reference current circulates, the value of which is imposed by the value of the resistance of the resistive element 130 and by the value of the saturation voltage $V_{Dsat}$ of the fifth transistor 126 and the value of the gate—source voltage $V_{GS}$ of the sixth transistor 128. The current mirror also comprises a second branch comprising the third and fourth transistors 122, 124 into which the current circulating in the first branch is duplicated, thus forcing extraction of the heating current from the portion 106.

Although not shown, the control circuit 116 includes electronic elements similar to the elements 118 to 130 described above to form the other heating current sources that will heat the other parts of the portion 106 and the other portions 106. For example, considering the example of portion 106 shown on FIG. 2 in which three heating currents "i" are injected from three input points 112, the electronic elements of the control circuit 116 heating this portion 106 include three sets of electronic elements, each similar to that corresponding to the electronic elements 118 to 130 shown on FIG. 3.

The number of heating current sources formed by the control circuit 116 for each portion 106, and the distances between the input points 112, between the output points 114, between the input and output points 112, 114 and the ends 108, 110 of the portion 106, depend particularly on the rate at which heat propagates in the PCM, in other words the thermal resistance associated with this PCM, and its thermal capacity. For example, for a GeTe portion 106 with an approximately rectangular parallelepiped shape as shown in FIG. 2, and having a section (area of the ends 108, 110) between about 100 nm² and 10000 nm², the number of heating current sources is chosen such that the input points 112 are separated from each other by a distance equal to about 10 µm, so that a phase change of the PCM of the portion 106 can be obtained after a heating period compatible with temporal specifications required for a state change of a switch used as an RF antenna switch. This distance between two adjacent input points 112 is similar to the distance between two adjacent output points 114. The distance between the ends 108, 110 of the portion 106 and the input and output points 112, 114 closest to these ends 108, 110 is for example equal to half this separation distance between two adjacent input points 112 and between two adjacent output points 114, for example in this case about 5 µm.

In order to change the switch 100 from the blocked state to the conducting state, that corresponds to a change of the PCM of the portions 106 of the switch 100 from the amorphous state to the crystalline state, the control signal CTR changes to the high state ($V_{DD}$) to make the transistors 120, 122 and 126 conducting. The heating current injected into the portion 106 by each first current source formed by the circuit 116 passes through the width b of the portion 106, this width b for example being of the order of a few hundred nanometers. At the beginning of this state change, due to the short distance (less than 1 µm) between the input point 112 and the facing output point 116 and the large distance from the other adjacent input points 112 (for example about 10 µm), the impedance between the input point 112 and the output point 116 faced by the first current source formed by the first and second transistors 118, 120, may for example be between about 20 kΩ and 100 kΩ that is less than the impedance between this input point 112 and an adjacent input point 112 that may for example be more than about 1 MΩ. Consequently, the current injected in the input point 112 circulates from this input point 112 to the output point 114 located facing this input point 112. This current circulating in the PCM thus creates self-heating of the PCM, this heating increasing with increasing resistance of the PCM.

The electronic elements of the control circuit 116 are sized such that when the state of the switch 100 changes from the blocked state to the conducting state, for a power supply voltage $V_{DD}$ of the order of 2V, the heating current named "I1" in this case passing through the portion 106 causes a voltage drop between the input point 112 and the output point 114 less than about 1V for transistors comprising active silicon zones, for example made using the 130 nm PD-SOI (partially deserted silicon on insulator) technology on an HR (High Resistivity, e.g. of the order of 1 kΩ·cm) silicon substrate. Furthermore, the value R1 of the variable resistance 130 during this state change may be chosen such that:

R1×I1+$V_{Dsat}$(126)+$V_{GS}$(128)=$V_{DD}$, where $V_{Dsat}$(126) is the saturation voltage of the fifth transistor 126, and $V_{GS}$(128) is the voltage between the gate and the source of the sixth transistor 128.

This heating of the PCM, above the PCM changeover temperature, causes a change in its phase corresponding to the change from the amorphous state to the crystalline state. As soon as the phase change has been made, the current sources formed by the circuit 116 are cut off (when the control signal CTR blocking the transistors 120, 122 and 126 changes to the low (GND) state) to stop heating currents from circulating in portions 106.

The state change of the PCM in portions 106 from the amorphous state to the crystalline state may be detected in different ways, for example by measuring the voltage at the terminals of portions 106 (voltage close to 0 V when the portions 106 are conducting), or by measuring the temperature or impedance in the portions 106.

In order to change the switch 100 from the conducting state of to the blocked state, that corresponds to a change of the PCM of the portions 106 of the switch 100 from the crystalline state to the amorphous state, the control signal CTR changes to the high state to make the transistors 120, 122 and 126 conducting. The heating current injected into the portion 106 by each current source formed by the control circuit 116 passes through the width b of the portion 106. In the same way as when changing from the blocked state to the conducting state described above, due to the short distance (less than 1 µm) between the input point 112 and the facing output point 116 and the large distance from the other adjacent input points 112 (for example about 10 µm), the impedance between the input point 112 and the output point 116 faced by the first current source formed by the first and second transistors 118, 120, may for example be between about 1 mΩ and 10 mΩ that is less than the impedance between this input point 112 and an adjacent input point that may for example be between about 20 mΩ and 100 mΩ. Consequently, the current injected in the input point 112 circulates from this input point 112 to the output point 116 located facing this input point 112. This current circulating in the PCM thus creates self-heating of the PCM, this heating increasing with increasing the value of this current.

The electronic elements of the control circuit 116 are sized such that when the state of the switch 100 changes from the conducting state to the blocked state, for a power supply voltage $V_{DD}$ of the order of 2V, the heating current named "I2" in this case passing through the portion 106 causes a voltage drop between the input point 112 and the output point 114 equal to less than about 1V for transistors like those described above. Furthermore, the value R2 of the variable resistance 130 during this state change may be chosen such that:

$$R2 \times I2 + V_{Dsat}(126) + V_{GS}(128) = V_{DD}.$$

This heating of the PCM above the PCM changeover temperature causes a change in its phase from the crystalline state to the amorphous state. As soon as the phase change has been made, the current sources formed by the control circuit 116 are cut off (when the control signal CTR blocking the transistors 120, 122 and 126 changes to the low state) to stop heating currents from circulating in portions 106.

When the PCM changes to the amorphous state, the voltage at the terminals of each of the portions 106 will tend towards $V_{DD}$, which stops operation of current sources formed by the control circuit 116. The state change of the PCM in portions 106 from the crystalline state to the amorphous state may be detected for example by measuring the voltage at the terminals of portions 106 (voltage close to $V_{DD}$ when the portions 106 are blocked), or by measuring the current output by the current sources.

Figure 4:
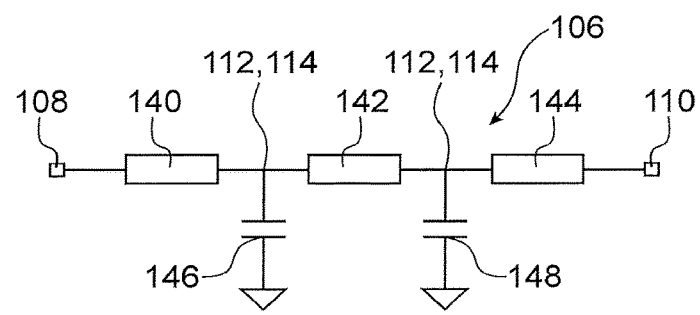
FIG. 4 diagrammatically shows an equivalent electrical circuit for a PCM portion in the amorphous state coupled to a control circuit of the switch.

FIG. 4 diagrammatically shows an equivalent electrical circuit of one of the portions 106 coupled to the current sources formed by the control circuit 116 when the PCM is in the amorphous state. The example in FIG. 4 corresponds to a portion 106 through which two heating currents will pass from two input points 112 to two output points 114.

The resistances 140, 142 and 144 correspond to different parts of the PCM of portion 106. Thus, the resistance 140 corresponds to the PCM located between the first end 108 and the first input and output points 112, 114 to which the control circuit 116 is connected. The resistance 144 corresponds to the PCM located between the second input and output points 112, 114 to which the control circuit 116 is connected, and the second end 110. The resistance 142 is formed by the PCM located between the first and second input and output points 112, 114. For example, the value of each of these resistances 140, 142 and 144 is of the order of 1 MΩ.

Each of the capacitances 146, 148, named Coff, corresponds to the sum of the parasite capacitances formed by the transistors in the control circuit 116 forming the current sources connected to the input and output points 112, 114, and particularly the drain-source capacitances and the gate-source capacitances of these transistors.

Figure 5:
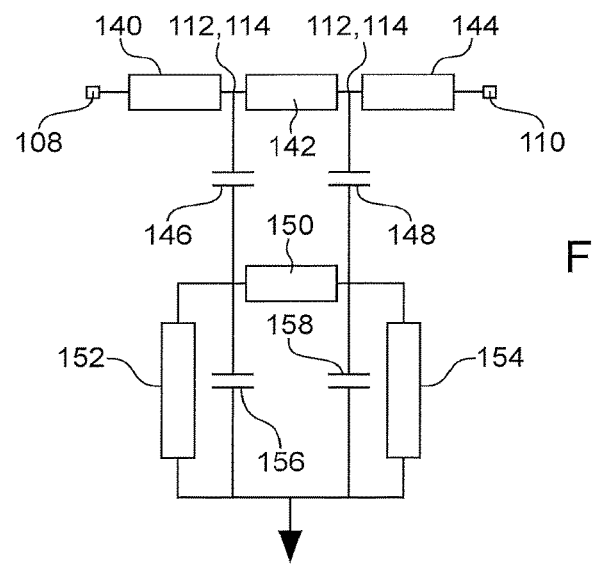
FIG. 5 diagrammatically shows an equivalent electrical circuit for a PCM portion in the amorphous state coupled to a control circuit of the switch, and a substrate on which this PCM portion is located.

Taking account of the substrate on which the portions 106 are made, the equivalent electronic circuit in FIG. 4 may be modified as illustrated in FIG. 5. Considering the substrate, three additional resistances 150, 152 and 154 and two additional capacitances 156, 158 have been added in this equivalent electrical diagram.

The input impedance Zin of the circuit shown on FIG. 5 (impedance between the first end 108 and the ground) is such that:

$$Zin = \sum_{k=0}^{n} \left( Zk + \frac{1}{J \cdot Coff} + \frac{RsubV}{(1 + \tau subV)} \right)$$

Where Zk: resistances of the different parts of the PCM of portion 106 (corresponding to resistances reference 140, 142 and 144 on FIG. 5);

RsubV: sum of the resistances formed by the different parts of the substrate (corresponding to resistances reference 152, 154 on FIG. 5);

τsubV=RsubV×value of the sum of capacitances 156 and 158.

The value of this input impedance Zin is equal to several MΩ and the electrical schematic in FIG. 5 can be considered like an open circuit when the PCM is in the amorphous state.

The output impedance Zout of the circuit shown on FIG. 5 (impedance between the second end 110 and the ground) is such that:

$$Zout = \sum_{k=n}^{0} \left( Zk + \frac{1}{J \cdot Coff} + \frac{RsubV}{(1 + \tau subV)} \right)$$

The value of this output impedance is similar to the value of the input impedance Zin and therefore the circuit formed can be considered like an open circuit.

The value of the impedance formed between the ends 108, 110, denoted Ziso, is such that:

$$Ziso = \sum_{k=0}^{n} \frac{Zk \times \left( \frac{1}{J \cdot Coff} + Rsubk \right)}{Zk + Rsubk + \frac{1}{J \cdot Coff}}$$

Rsubk: resistances formed by the different parts of the substrate between the different sets of input and output points (corresponding to the resistance reference 150 on FIG. 5).

Thus, as the values of Rsubk and 1/j.Coff increase, the value of the impedance formed between the ends 108, 110 becomes closer to the sum of the resistances of the different parts of PCM in portion 106. Considering that the value of Rsubk is determined by the resistivity of the substrate and is much less than about 1 kΩ, it is judicious to have a very low value Coff.

Figure 6:
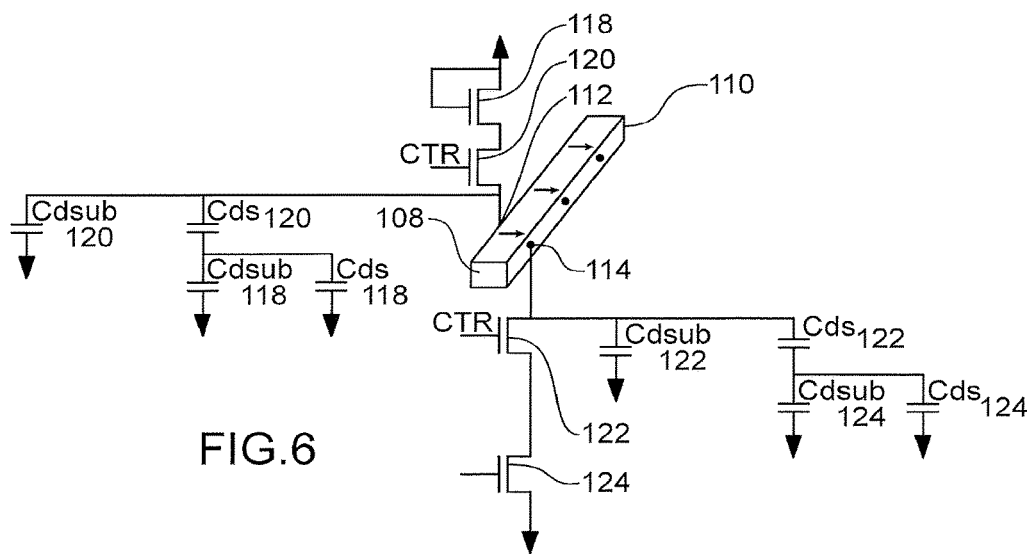
FIG. 6 diagrammatically shows the different parasite capacitances connected to the PCM portion and that are connected to the transistors of the control circuit of the switch.

FIG. 6 shows the different parasite capacitances connected to the portion 106 and connected to the transistors of the control circuit 116. The capacitances $Cdsub_{118}$, $Cdsub_{120}$, $Cdsub_{122}$ and $Cdsub_{124}$ correspond to the capacitances between the substrate and the drain respectively of transistors 118, 120, 122 and 124. The capacitances $Cds_{118}$, $Cds_{120}$, $Cds_{122}$ and $Cds_{124}$ correspond to the drain—source capacitances of each of the transistors 118, 120, 122 and 124.

After reduction, the equation determining the value of 1/Coff as a function of parasite capacitances becomes:

$$\frac{1}{Coff} = \frac{(Cds120 + 1) \times (Cds122 + 1)}{(Cds120 + 1)x((Cds122 + 1) \times Cdsub122 + 1) + (Cds122 + 1) \times ((Cds120 + 1) \times Cdsub120 + 1)}$$

Thus, the parasite capacitances of the transistors 118 and 124 do not have any impact on the value of 1/Coff. Transistors 120 and 122 are preferably made such that their parasite capacitances can increase the impedance between the portion 108 and the ground, and thus reduce losses in the switch 100.

Figure 7:
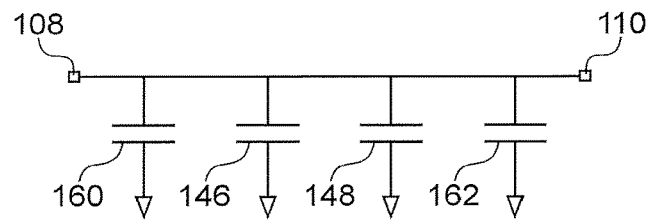
FIG. 7 diagrammatically shows an equivalent electrical circuit of the PCM portion of the switch, coupled to the current sources formed by the control circuit when the PCM is in the crystalline state.

FIG. 7 diagrammatically shows an equivalent electrical circuit of the portion 106 coupled to the current sources formed by the control circuit 116 when the PCM is in the crystalline or conducting state.

Unlike the circuits shown on FIGS. 4 and 5, the equivalent circuit in FIG. 7 does not include an electrical resistance since the PCM is in the crystalline state. Thus, this equivalent electrical circuit only includes capacitances 146, 148 with values Coff, and capacitances 160, 162 also with the value Coff.

In order to make the switch 100 described above, the electronic elements of the control circuit 116 may be made in the front-end part of the integrated circuit of which the switch 100 forms part. PCM portions 106 may be made within one of the metallic interconnection levels of the back end part of the circuit. In this case the electronic components (particularly transistors) of the control circuit 116 are connected to the PCM portions 106 through conducting vias passing through the interlayer dielectric and possibly one or several other levels of metallic interconnections located between the semiconducting layer in which the electronic components are fabricated and the metallic interconnections level in which the PCM portion 106 is formed.

As a variant to the particular embodiment described above, the control circuit 116 may comprise a current or voltage digital—analogue converter or more generally any electronic means of imposing circulation of a heating current through the PCM portions 106, instead of the transistors 122-128 forming the current mirror.

Figure 12:
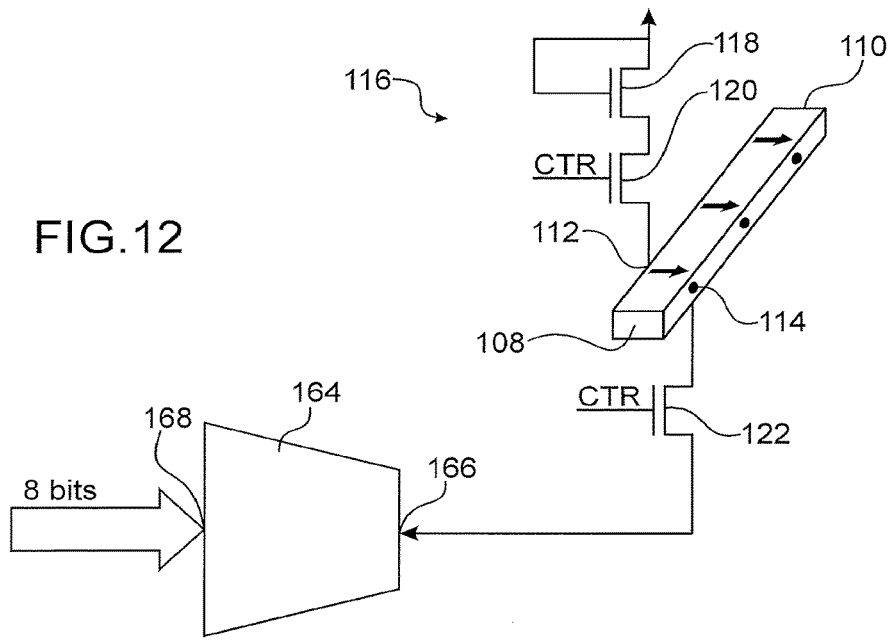
FIGS. 12 and 13 diagrammatically show a part of the electronic elements of a control circuit of a switch according to different variant embodiments.

FIG. 12 shows such a variant in which the control circuit 116 comprises current digital—analogue converters 164, instead of the current mirror comprising transistors 122, 124, 126 and 128 and the resistive element 130, each comprising an output 166 connected to one of the output points 114 through the MOS transistor 122. In this variant, the value of the heating current circulating through the PCM portion 106 depends on the value of an input signal, for example an 8-bit signal, applied to an input 168 of the digital—analogue converter 164.

Figure 13:
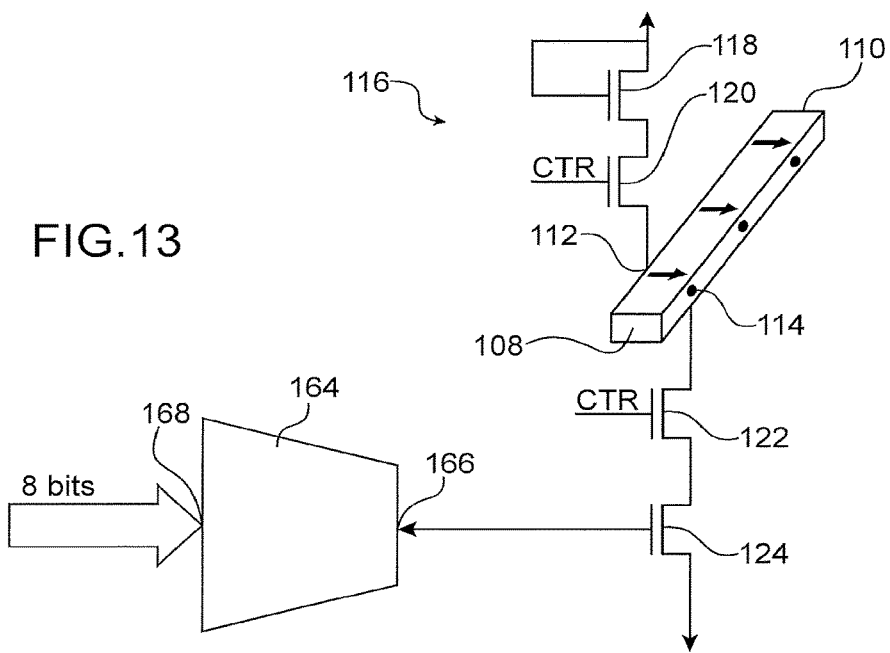

FIG. 13 shows another variant in which the digital—analogue converters 164 operate in voltage and impose values of the heating currents passing through the PCM portion 106 via values of output signals 166 from the converters 164 applied to the gates of the MOS transistors 124.

Figure 8:
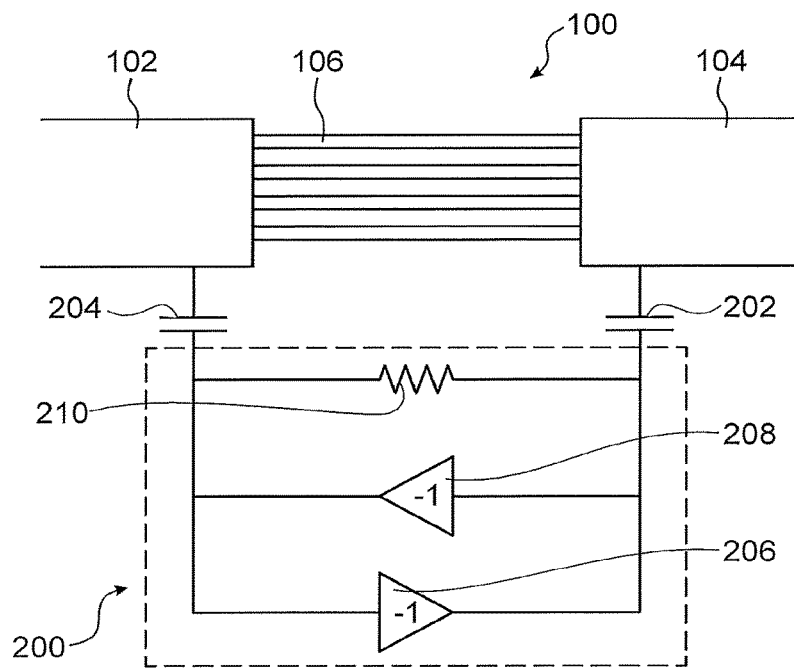
FIG. 8 diagrammatically shows a switch comprising a device for compensation of parasite capacitances of transistors of the switch control device.

The switch 100 may be coupled to a compensation device 200 as shown in FIG. 8, to reduce constraints on the size of transistors, for example when it is impossible to reduce transistor sizes to reduce their parasite capacitances.

The device 200 comprises a first capacitive element 202, a first electrode of which is connected to the output 104 from switch 100, and a second capacitive element 204, a first electrode of which is connected to the input 102 of the switch 100. The device 200 also comprises a first inverter 206, the input of which is connected to the second electrode of the capacitor 204 and the output of which is connected to the second electrode of the capacitor 202, and a second inverter 208 in antiparallel to the inverter 206, the input of which is connected to the second electrode of the capacitor 202 and the output of which is connected to the second electrode of the capacitor 204.

The values of the capacitances of the capacitive elements 202, 204 are preferably similar to the values of the parasite capacitance that is to be compensated, for example between 0.8 and 1.2 times the value of this parasite capacitance.

The device 200 also comprises a resistive element 210 that acts as a polarisation point for the inverters 206, 208 when the switch 100 is in the OFF state.

The addition of such a device 200 to compensate for the parasite capacitances of MOS transistors that will activate or deactivate the first and second current sources formed by the control device 116 reduces constraints on the design of the transistors, to prevent the presence of large parasite capacitances in these MOS transistors.

Figure 9:
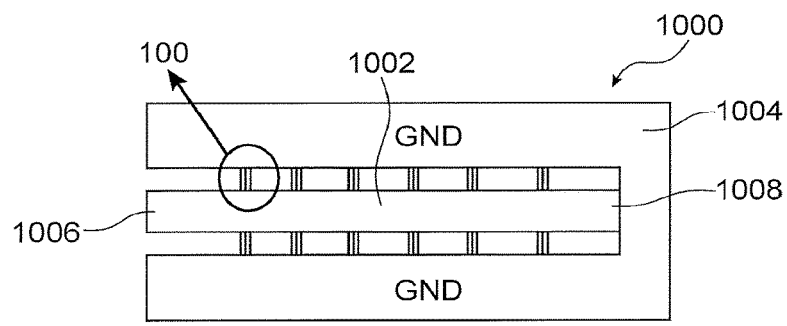
FIG. 9 diagrammatically shows a matching device for a transmission line comprising a plurality of switches.

FIG. 9 diagrammatically shows an example embodiment of a device 1000 for matching a transmission line, also named a variable stub, comprising several switches 100 similar to that described above. The device 1000 comprises a first conducting line 1002 or first portion of electrically conducting material, and a second conducting line 1004 or second electrically conducting portion, between which several switches 100 are inserted. The conducting lines 1002, 1004 and the portions 106 of switches 100 are advantageously made in the same level of metallic interconnections of a circuit. The second line 1004 partly surrounds the first line 1002. A first end 1006 of the first conducting line 1002 will be connected to the transmission line (not visible on FIG. 9) the impedance of which is to be matched by the device 1000. A second end 1008 of the first conducting line 1002 is connected to the second conducting line 1004.

The ends 108, 110 of the PCM portion(s) 106 of each of the switches are coupled to the first and second conducting lines 1002, 1004 at different distances from the first end 1006 of the first conducting line 1002 such that the matching length of the device 1000 can be determined from the distance between the first end 1006 of the first conducting line 1002 and the closest switch 100 in the conducting state to the first end 1006.

Unlike a matching device using transistors to determine the matching length of the device, the use of switches 100 comprising PCM portions can reduce the value of the electrical resistance of the matching device in the conducting state (Ron), thus increasing the quality factor that can be obtained. Such a matching device, for example used in a power amplifier, can improve the qualities of this amplifier.

Figure 10:
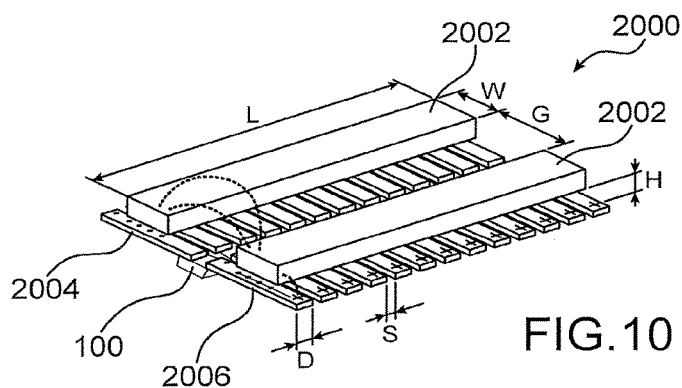
FIGS. 10 and 11 diagrammatically show a phase shift device for a differential transmission line comprising a plurality of switches.
Figure 11:
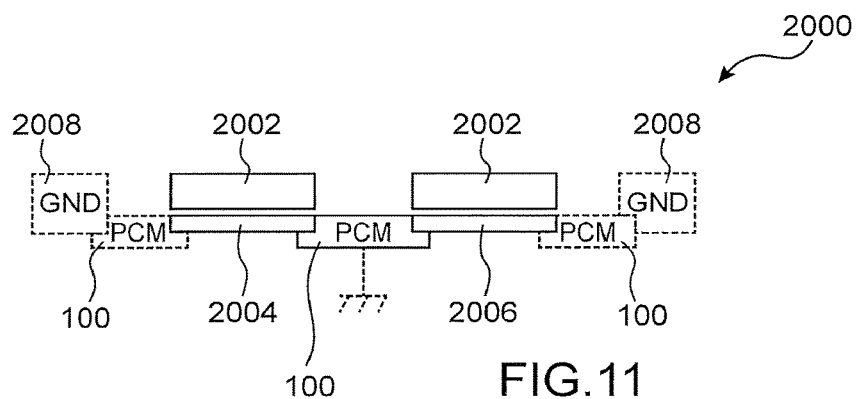

Switches 100 may also be used to make a phase shift system for a differential transmission line 2000, for example used in an array of antennas. An example embodiment of such an RF phase shift system 2000 is shown in FIGS. 10 and 11.

This system 2000 comprises a differential transmission line formed from two electrically conducting portions 2002. The RF signals will pass through its portions 2002 parallel to their length L. First delay lines 2004 are arranged under one of the portions 2002, and second delay lines 2006 are arranged under the other of the portions 2002. The wave transmitted in the portions 2002 is more or less slowed, depending on the number of delay lines 2004 connected to the ground or to each other.

The delay lines 2004 are connected to each other by switches 100 in contact with two delay lines 2004 each located under one of the portions 2002. Other switches 100 are inserted between each of the delay lines 2004 and the conducting portions 2008 connected to the ground 2006. As a variant, instead of being connected to the ground through conducting portions 2008 and switches 100 connected between the delay lines 2004, 2006 and these conducting portions 2008, the delay lines 2004, 2006 may be connected to the ground through a ground connection formed directly on the switches 100 inserted between the delay lines 2004, 2006.

The invention claimed is:

1. A switch comprising at least one PCM portion that can be in a conducting or blocked state depending on the amorphous or crystalline state of the PCM that can change state when it is heated,
in which the PCM portion is continuous and has an elongated shape such that an input and an output of the switch are connected to two ends of the PCM portion respectively that are spaced at a distance from each other corresponding to the largest dimension of the PCM portion,
and comprising a device to control the state of the switch capable of passing heating currents through the PCM portion, approximately perpendicular to the largest dimension of the PCM portion, from at least two input points at a distance from each other and at a distance from the ends of the PCM portion, to at least two output points at a distance from each other and at a distance from the ends of the PCM portion.

2. The switch according to claim 1, in which the control device comprises a plurality of electronic components that form first current sources each capable of injecting one of the heating currents into the PCM portion from one of the input points, and second current sources each capable of extracting one of the heating currents from one of the output points.

3. The switch according to claim 2, in which the first and second current sources formed by the electronic components of the control device can be controlled simultaneously by a same control signal CTR.

4. The switch according to claim 3, in which each of the first current sources comprises at least one MOS transistor comprising one of its source and drain electrodes connected to one of the input points and the other of its source and drain electrodes to an electrical power supply voltage, and in which the control signal CTR can be applied to the gate.

5. The switch according to claim 3, in which each of the second current sources comprises at least several MOS transistors mounted in a current mirror, at least one of said MOS transistors having a gate to which the control signal CTR can be applied.

6. The switch according to claim 5, in which each of the second current sources also comprises at least one resistive element coupled to the current mirror and capable of forming a resistance with a first or a second value, different from each other and such that the value of the heating current extracted by the second current source is adapted as a function of the state of the switch that will be controlled by the control device.

7. The switch according to claim 3, in which each of the second current sources are formed from at least one digital - analogue converter.

8. The switch according to claim 1, in which the PCM portion is in the form of a rectangular parallelepiped with a length greater than its width and its thickness.

9. The switch according to claim 8, in which the input points and output points are located on side faces of the PCM portion, separated from each other by a distance equal to its width.

10. The switch according to claim 1, comprising several PCM portions located side by side and approximately parallel to each other, the control device being capable of passing heating currents through each of the PCM portions, approximately perpendicular to the largest dimension of each of the PCM portions, from at least two input points separated from each other and separated from the ends of each of the PCM portions, to at least two output points separated from each other and separated from the ends of each of the PCM portions.

11. The switch according to claim 2, in which the switch also comprises a device coupled to the ends of the PCM portions and capable of compensating for parasite capacitances of MOS transistors that will activate or deactivate the first and second current sources.

12. The switch according to claim 2, in which said electronic components comprise active zones formed in at least one semiconducting layer, and in which the PCM portion is located within a metallic interconnections level located above the semiconducting layer and separated from the semiconducting layer by at least one interlayer dielectric.

13. A transmission line matching device, comprising at least:
a first portion of electrically conducting material comprising a first end that will be connected to the transmission line and a second end connected to at least one second portion of the electrically conducting material that will be connected to a reference potential,
a plurality of switches according to claim 1, the ends of the PCM portions of each of the switches being coupled to the first and second portions of electrically conducting material at different distances from the first end of the first portion of electrically conducting material such that the matching length of the device can be defined by the distance between the first end of the first portion of electrically conducting material and the switch in the conducting state closest to the first end of the first portion of electrically conducting material.

14. A phase shift device for a differential transmission line, comprising at least:
several first delay lines that will be coupled to a first electrically conducting portion of the differential transmission line;
several second delay lines that will be coupled to a second electrically conducting portion of the differential transmission line;
several switches according to claim 1, the ends of the PCM portions of each of the switches being coupled to one of the first delay lines and to one of the second delay lines such that said first and second delay lines can be electrically connected to each other when the switch is in the conducting state and can be connected to a reference electrical potential when the switch is in the blocked state.

* * * * *